United States Patent [19]

Itakura

[11] Patent Number: 5,280,199
[45] Date of Patent: Jan. 18, 1994

[54] DIFFERENTIAL INPUT CIRCUIT AND OPERATIONAL AMPLIFIER WITH WIDE COMMON MODE INPUT VOLTAGE RANGE

[75] Inventor: Tetsuro Itakura, Kanagawa, Japan

[73] Assignee: Kabushiki Kaisha Toshiba, Kawasaki, Japan

[21] Appl. No.: 882,535

[22] Filed: May 13, 1992

[30] Foreign Application Priority Data

May 14, 1991 [JP] Japan .................. 3-108022

[51] Int. Cl.[5] .......................... H03K 5/22; H03F 3/45
[52] U.S. Cl. .................... 307/355; 307/530; 307/494; 330/253; 330/261
[58] Field of Search ............... 330/253, 261; 307/355, 307/530, 491, 494, 362

[56] References Cited

U.S. PATENT DOCUMENTS

| | | | |
|---|---|---|---|
| 4,536,663 | 8/1985 | Miller et al. | 307/355 |
| 4,554,515 | 11/1985 | Burson et al. | 330/261 |
| 4,555,673 | 11/1985 | Huijsing et al. | 330/258 |
| 4,580,106 | 4/1986 | Vittoz | 330/261 |
| 4,728,900 | 3/1988 | Nakagawara et al. | 330/253 |
| 4,825,104 | 4/1989 | Yamakoshi et al. | 307/355 |
| 4,901,031 | 2/1990 | Kalthoff et al. | 330/261 |
| 5,065,050 | 11/1991 | Fernandez | 307/362 |
| 5,185,582 | 2/1993 | Barbu | 330/261 |

FOREIGN PATENT DOCUMENTS 61-230413 10/1986 Japan .

OTHER PUBLICATIONS

IEEE Journal of Solid-State Circuits, vol. sc-20, No. 6, Dec. 1985, "Low-Voltage Operational Amplifier with Rail-to-Rail Input and Output Ranges"; Johan H. Huijsing, et al. pp. 1144-1150.

IEE Journal of Solid-State Circuits, vol. 25, No. 2, Apr. 1990, "A Rail-To-Rail Input/Output CMOS Power Amplifier"; M. D. Pardoen, et al. pp. 501-504.

Primary Examiner—William L. Sikes
Assistant Examiner—Toan Tran
Attorney, Agent, or Firm—Oblon, Spivak, McClelland, Maier & Neustadt

[57] ABSTRACT

A differential input circuit capable of realizing a wide common mode input range, without using a current summing circuit, in which the total output current is independent of the common mode input voltage level. The circuit includes: a first differential pair formed by two transistors connected to a current source; a second differential pair connected to the current source in parallel to the first differential pair, including two transistor combinations, each of which is formed by two transistors of mutually complementary conductivity/polarity types having source/emitter electrodes connected to each other; in which bias voltages are applied to gate/base electrodes of one of transistors of each transistor combination in the second differential pair which has an identical conductivity/polarity type as the transistors of the first differential pair. The outputs are connected with the first and second differential pairs such that the first and second differential pairs have the same output current direction. Differential and operational amplifier configurations using this differential input circuit are also disclosed.

20 Claims, 17 Drawing Sheets

DIFFERENTIAL INPUT CIRCUIT AND OPERATIONAL AMPLIFIER WITH WIDE COMMON MODE INPUT VOLTAGE RANGE

BACKGROUND OF THE INVENTION

1. Field of the Invention

The present invention relates to a differential input circuit to be utilized for example in an operational amplifier or a differential amplifier.

2. Description of the Background Art

A differential input circuit for inputting the differential input signals has conventionally been realized in a form of a differential pair using field effect transistors (FET) or bipolar transistors. Such a conventionally known differential input circuit configuration has been associated, however, with a limited common mode input voltage range for the differential input signals, because of the gate-source voltage $V_{gs}$ of the FETs used in the differential pair or the base-emitter voltage $V_{be}$ of the bipolar transistors used in the differential pair.

In order to improve this situation, there has been a proposition for widening the common mode input voltage range for the differential input signals by taking a current sum of outputs of two differential pairs of complementary conductivity types, as discussed in "A Rail-to-Rail Input/output CMOS Power Amplifier", IEEE Journal of Solid State Circuits, Vol. 25, No. 2, pp. 501-504, April 1990. (See FIG. 1 of this reference in particular.)

However, according to this proposition, the directions of the output currents of two differential pairs of complementary conductivity types are opposite to each other, so that it is indispensable in this configuration to have a current summing circuit for summing two oppositely directed output currents. For this reason, it is unavoidable in this configuration to have additional circuit components, and consequently it is inevitable for this configuration to have a large circuit size and to be more expensive.

Moreover, this configuration has been associated with a problem that a sum of the output currents obtained from the differential pair varies depending on the common mode input voltage level, because of the matching error in the current sources of the differential pair and the error in the current summing circuit, which may be occuring at the common mode input voltage level at which one of the differential pair is hardly operating and the other one of the differential pair is operating predominantly, or at the common mode input voltage level at which both of the differential pair are operating simultaneously. As a consequence, when this configuration is utilized in the differential amplifier circuit having resistor loads, the variations in the output levels is produced so that the stable operation is not obtainable.

SUMMARY OF THE INVENTION

It is therefore an object of the present invention to provide a differential input circuit capable of realizing a wide common mode input voltage range, without using a current summing circuit, in which a sum of the output currents obtained from the differential pair does not depend on the common mode input voltage level.

It is another object of the present invention to provide an operational amplifier circuit using such a differential input circuit.

According to one aspect of the present invention there is provided a differential input circuit, comprising: a first differential pair formed by first and second FET type transistors connected to a current source, said first and second FET type transistors having gate electrodes for receiving voltages corresponding to input voltages applied to first and second input terminals, respectively, and connected to first and second output terminals, respectively; a second differential pair formed by first and second FET type transistor combinations, each of the first and second FET type transistor combination comprising two FET type transistors of mutually complementary conductivity types having source electrodes connected to each other, said second differential pair being connected to the current source in parallel to the first differential pair, and one of said two FET type transistors of the first and second FET type transistor combinations which has a different conductivity type from the FET type transistors of the first differential pair has a gate electrode for receiving the voltages corresponding to the input voltages applied to the first and second input terminals, respectively, while another one of said two FET type transistors of the first and second FET type transistor combinations which has an identical conductivity type as the FET type transistors of the first differential pair is connected to the second and first output terminals, respectively; and a bias circuit for deriving and supplying bias voltages to a gate electrode of one of said two FET type transistors of each of the first and second FET type transistor combinations in the second differential pair which has an identical conductivity type to the FET type transistors of the first differential pair.

According to another aspect of the present invention there is provided a differential input circuit, comprising: a first differential pair formed by first and second bipolar transistors connected to a current source, said first and second bipolar transistors having base electrodes for receiving voltages corresponding to input voltages applied to first and second input terminals, respectively, and connected to first and second output terminals, respectively; a second differential pair formed by first and second bipolar transistor combinations, each of the first and second bipolar transistor combination comprising two bipolar transistors of mutually complementary polarity types having emitter electrodes connected to each other, said second differential pair being connected to the current source in parallel to the first differential pair, and one of said two bipolar transistors of the first and second bipolar transistor combinations which has a different polarity type from the bipolar transistors of the first differential pair has a base electrode for receiving the voltages corresponding to the input voltages applied to the first and second input terminals, respectively, while another one of said two bipolar transistors of the first and second bipolar transistor combinations which has an identical polarity type as the bipolar transistors of the first differential pair is connected to the second and first output terminals, respectively; and a bias circuit for deriving and supplying bias voltages to a base electrode of one of said two bipolar transistors of each of the first and second bipolar transistor combinations in the second differential pair which has an identical polarity type to the bipolar transistors of the first differential pair.

Other features and advantages of the present invention will become apparent from the following descrip-

DETAILED DESCRIPTION OF THE PREFERRED EMBODIMENTS

Figure 1:
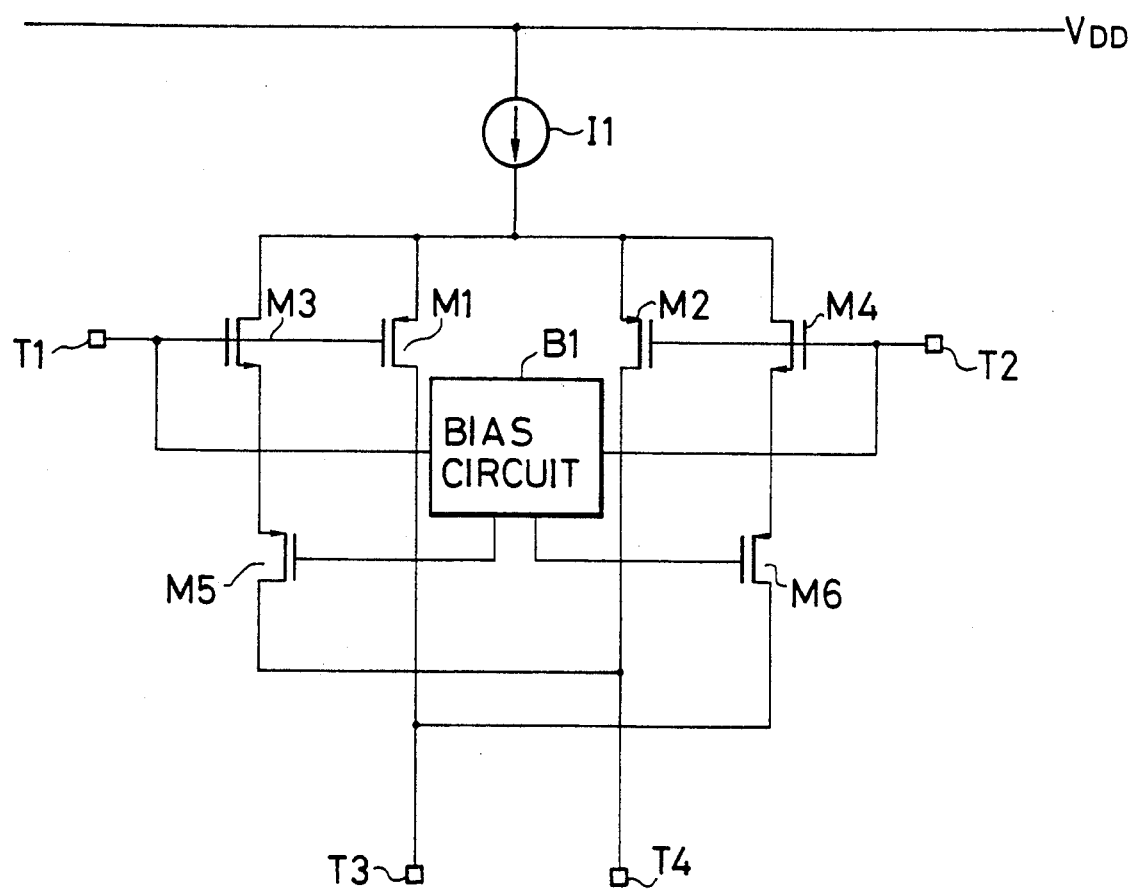
FIG. 1 is a generic circuit diagram of a first embodiment of a differential input circuit according to the present invention.

Referring now to FIG. 1, a first embodiment of a differential input circuit according to the present invention will be described in detail.

This configuration of FIG. 1 has a first differential pair formed by P-MOSFET (M1) and P-MOSFET (M2), and a second differential pair formed by a combination of N-MOSFET (M3) and P-MOSFET (M5) and a combination of N-MOSFET (M4) and P-MOSFET (M6), where source electrodes of the FETs M3 and M5 are connected in series and source electrodes of the FETs M4 and M6 are connected in series. These first and second differential pairs are connected in parallel, and gate electrodes of the FETs M1 and M3 are connected to an input terminal T1 while gate electrodes of the FETs M2 and M4 are connected to another input terminal T2, and drain electrodes of the FETs M1 and M6 are connected to an output terminal T3 while drain electrodes of the FETs M2 and M5 are connected to another output terminal T4.

In this configuration, a current source I1 is connected to a voltage source $V_{DD}$, and an output of this current source I1 is connected to source electrodes of FETs M1 and M2, as well as to drain electrodes of FETs M3 and M4.

In addition, there is provided a bias circuit B1 which is connected to the input terminals T1 and T2, and supplies a bias voltage $V_b$ to gate electrodes of the FETs M5 and M6, where the bias voltage $V_b$ is derived from the input voltages V1 and V2 applied at the input terminals T1 and T2. Here, the bias voltage $V_b$ should have such a magnitude that, when the input voltages V1 and V2 applied at the input terminals T1 and T2 are balanced so that a half of the output currents from the current source I1 is distributed to the FETs (M3, M5) side and a remaining half of the output currents from the current source I1 is distributed to the FETs (M4, M6) side, the sum of the gate-source voltages $V_{gs}$ of the FETs (M3, M5) or (M4, M6) are over the minimum required DC level for the second differential pair to operate.

In this configuration, the drain electrode of the FET (M5) is connected to the output terminal T4 while the drain electrode of the FET (M6) is connected to the output terminal T3, so as to have the identical current direction in the first and the second differential pairs.

Now, the operation of this differential input circuit will be described. Here, it is assumed that the N-MOSFETs (M3, M4) have the threshold voltage $V_{thn}$, the P-MOSFETs (M1, M2, M5, M6) have the threshold voltage $V_{thp}$, and the common mode input voltage $V_C$ is an average of the input voltages V1 and V2 applied at the input terminals T1 and T2. That is:

$$V_c = (V1 + V2)/2 \qquad (1)$$

In addition, the lowest voltage level of the circuit, which is usually a ground voltage level or a voltage level of a negative voltage source, is taken as $V_{SS}$.

In this configuration of FIG. 1, when the common mode input voltage $V_C$ is lower than $V_{thn} + |V_{thp}|$ with respect to the lowest voltage level $V_{SS}$, all of the FETs (M3, M4, M5, M6) of the second differential pair are in OFF states. Accordingly, the FETs (M1, M2) of the first differential pair operate as the usual differential circuit. Namely, in this case, when the input voltage V1 of the input terminal T1 is higher than the voltage level V2 of the input terminal T2, the gate-source voltage $V_{gs}$ of the FET (M2) becomes larger than the gate-source voltage $V_{gs}$ of the FET (M1), so that the output currents of the current source I1 are distributed more to the side of the FET (M2).

On the other hand, when the common mode input voltage $V_C$ is higher than $V_{DD} - |V_{thp}|$ with respect to the lowest voltage level $V_{SS}$, the FETs (M1, M2) of the first differential pair are in OFF states. In this case, the gate-source voltage $V_{gs}$ in the FETs (M3, M5) is equal to $(V1 - V_{b2})$ while the gate-source voltage $V_{gs}$ in the FETs (M4, M6) is equal to $(V2 - V_{b1})$, where $V_{b1}$ and $V_{b2}$ are the bias voltages derived from the input voltages V1 and V2, respectively, by the bias circuit B1.

Consequently, the gate-source voltage $V_{gs}$ in the FETs of the second differential pair which are connected to one of the input terminals T1 and T2 into which the larger input voltage is applied becomes larger, and the output currents of the current source I1 are distributed between the side of the FETs (M3, M5) and the side of the FETs (M4, M6) according to the gate-source voltage $V_{gs}$ in these FETs, so that the distribution of the output currents of the current source I1 is effectively carried out according to the magnitude of the input voltages V1 and V2, and therefore the FETs (M3, M4, M5, M6) of the second differential pair operates as the differential circuit.

When the common mode input voltage $V_C$ is lower than $V_{DD}-|V_{thp}|$ but higher than $V_{thn}+|V_{thp}|$ with respect to the lowest voltage level $V_{SS}$, the FETs (M1, M2) of the first differential pair as well as the FETs (M3, M4, M5, M6) of the second differential pair are in ON states simultaneously. However, in this configuration, the currents are supplied only from the single current source I1, so that the sum of the output currents from the first and second differential pairs is a constant, and therefore there is no variation in the output levels.

Thus, in this configuration of FIG. 1, even when the FETs (M1, M2) of the first differential pair are in OFF states as the input voltages V1 and V2 at the input terminals T1 and T2 become higher, the FETs (M3, M4, M5, M6) of the second differential pair are operable, so that the wider common mode input voltage range can be realized.

Furthermore, since the first and second differential pairs have the identical output current direction, there is no need for a current summing circuit for summing two oppositely directed output currents in this configuration.

Consequently, this configuration involves a reduced number of circuit components, and therefore it is possible in this configuration to have a compact circuit size and to be less expensive.

It is to be noted that all or a part of the FETs used in this configuration of FIG. 1 may be replaced by bipolar transistors, if desired.

Figure 2:
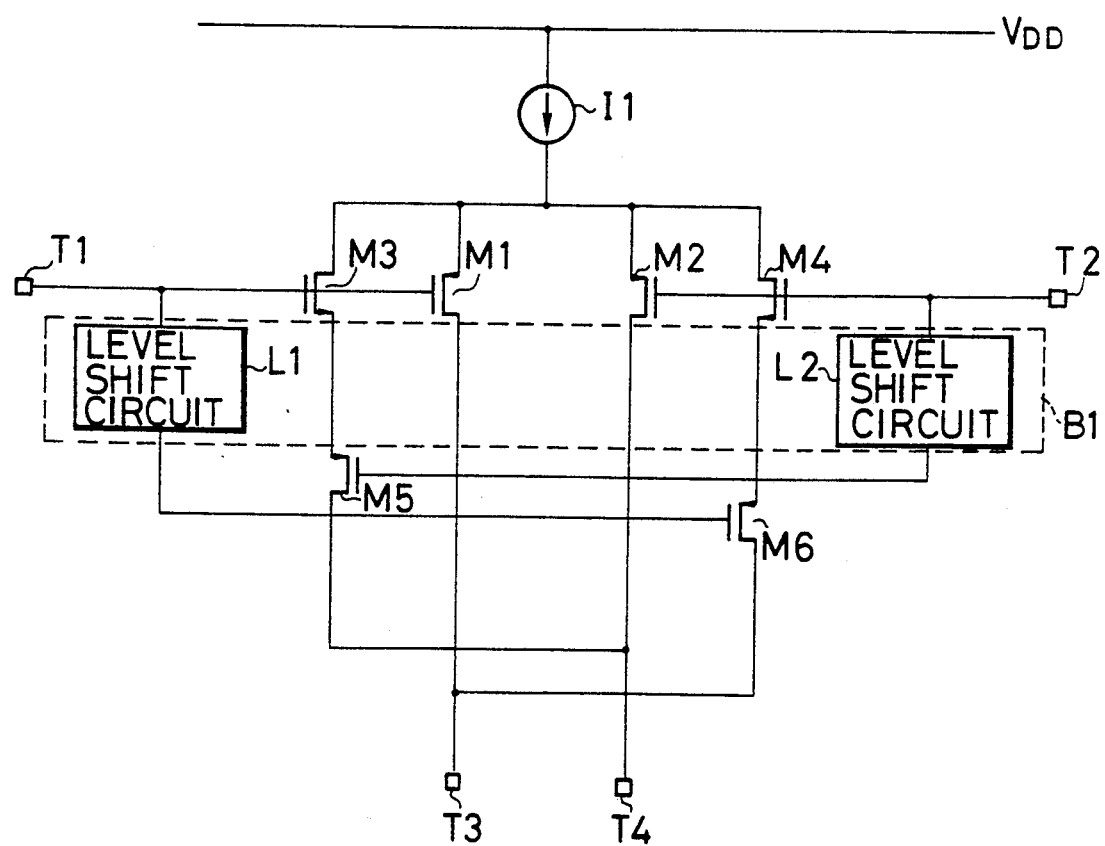
FIG. 2 is a circuit diagram of one specific configuration for the differential input circuit of FIG. 1.
Figure 3:
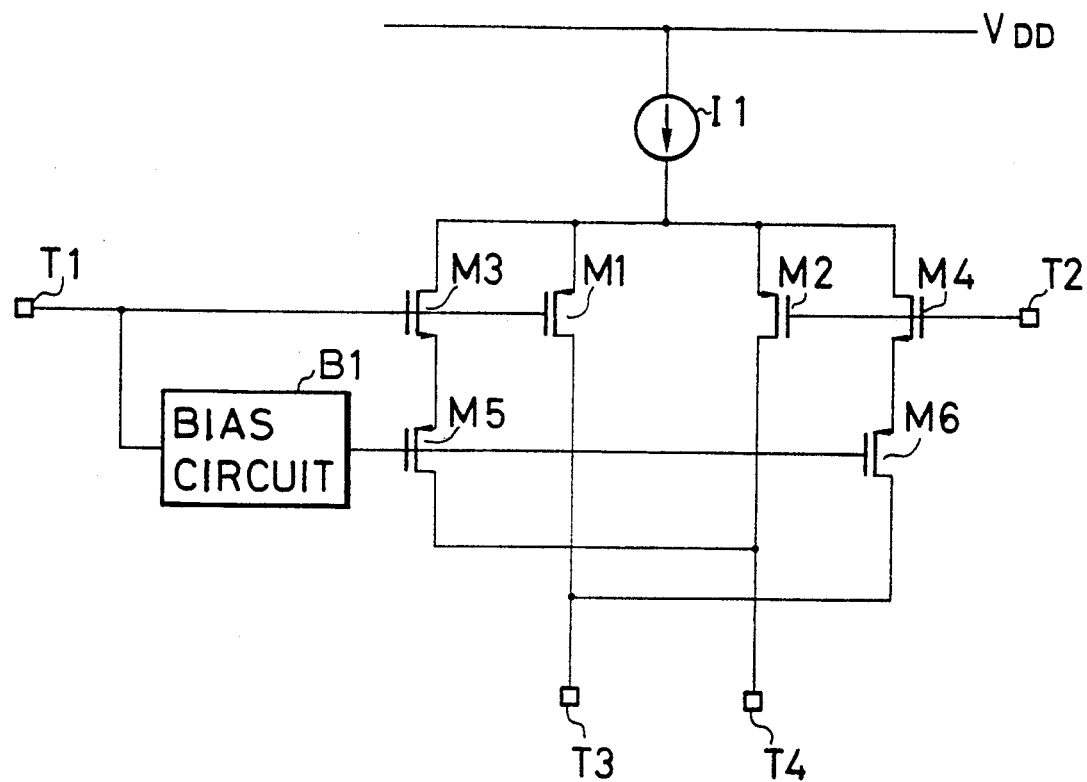
FIG. 3 is a circuit diagram of another specific configuration for the differential input circuit of FIG. 1.
Figure 4:
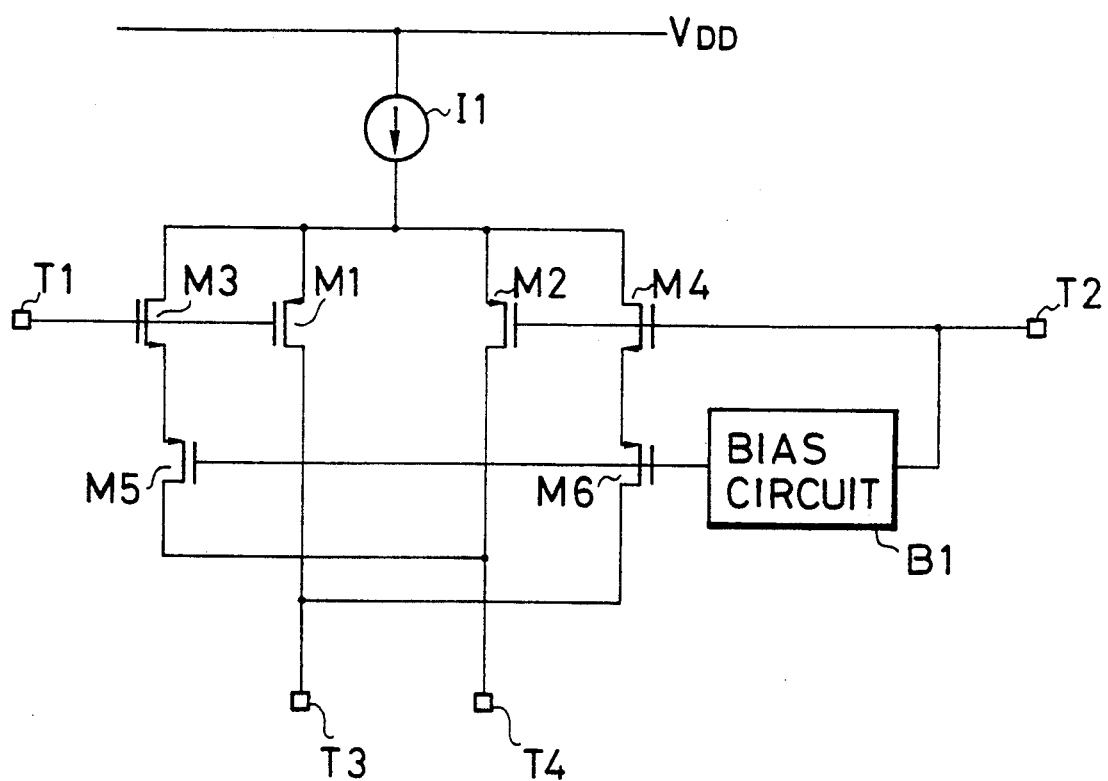
FIG. 4 is a circuit diagram of still another specific configuration for the differential input circuit of FIG. 1.

Referring now to FIG. 2 to FIG. 4, several specific configurations for the bias circuit in the above described first embodiment of a differential input circuit according to the present invention will be described.

In the specific configuration of FIG. 2, the bias circuit B1 comprises a level shift circuit L1 for generating the bias voltage $V_{b1}$ to be supplied to the gate electrode of the FET (M6) by level shifting the input voltage V1 at the input terminal T1, and a level shift circuit L2 for generating the bias voltage $V_{b2}$ to be supplied to the gate electrode of the FET (M5) by level shifting the input voltage V2 at the input terminal T2.

In the specific configuration of FIG. 3, the bias circuit B1 comprises a circuit for generating the bias voltage $V_b$ to be supplied to the gate electrodes of the FETs (M5, M6) according to the input voltage V1 at the input terminal T1.

On the other hand, in the specific configuration of FIG. 4, the bias circuit B1 comprises a circuit for generating the bias voltage $V_b$ to be supplied to the gate electrodes of the FETs (M5, M6) according to the input voltage V2 at the input terminal T2.

Figure 5:
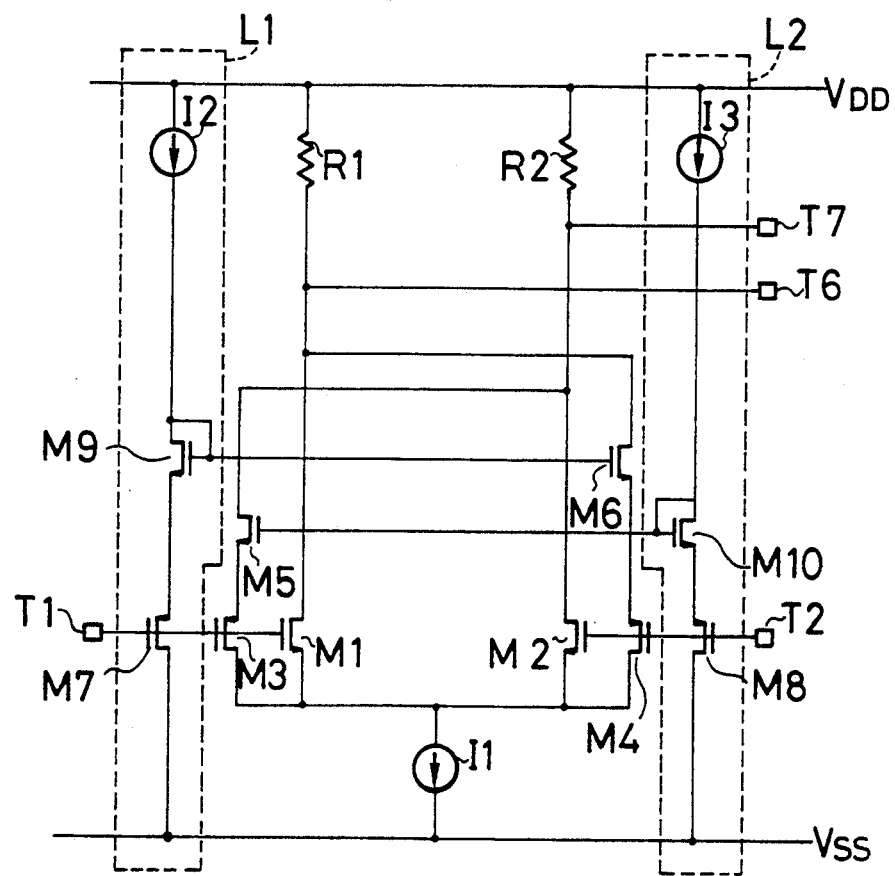
FIG. 5 is a circuit diagram of one embodiment of a differential amplifier circuit using the differential input circuit configuration of FIG. 2.

Referring now to FIG. 5, one embodiment of a differential amplifier circuit using the above described first embodiment of a differential input circuit shown in FIG. 1 with the specific configuration of the bias circuit as shown in FIG. 2 will be described in detail.

It is noted that in the configuration shown in FIG. 5, the conductivity types of all the elements involved are reversed from those shown in FIG. 2. Thus, the FETs (M1, M2, M5, M6) are N-MOSFETs, while the FETs (M3, M4) are P-MOSFETs in FIG. 5.

In this differential amplifier circuit of FIG. 5, the level shift circuit L1 comprises a current source I2 connected to the voltage source $V_{DD}$, P-MOSFET (M9) connected to an output of the current source I2 at the drain electrode, and P-MOSFET (M7) connected in series with the FET (M9), where the gate electrode of the FET (M7) is connected to the input terminal T1, the gate electrode of the FET (M6) is connected to the gate electrode of the FET (M9) as well as to the current source I2, the source electrodes of the FETs (M7, M9) are connected with each other, and the drain electrode of the FET (M7) is connected to the lowest voltage level $V_{SS}$.

Similarly, the level shift circuit L2 comprises a current source I3 connected to the voltage source $V_{DD}$, P-MOSFET (M10) connected to an output of the current source I3 at the drain electrode, and P-MOSFET (M8) connected in series with the FET (M10), where the gate electrode of the FET (M8) is connected to the input terminal T2, the gate electrode of the FET (M5) is connected to the gate electrode of the FET (M10) as well as to the current source I3, the source electrodes of the FETs (M8, M10) are connected with each other, and the drain electrode of the FET (M8) is connected to the lowest voltage level $V_{SS}$.

In addition, the output terminals T6 and T7 are connected with resistor loads R1 and R2, respectively, in order to output the differential outputs.

In this configuration of FIG. 5, when the input voltage V1 applied at the input terminal T1 is raised, the gate-source voltage $V_{g5}$ of the FET (M3) is lowered, such that the currents flowing into the FET (M3) decreases. As a result, the currents flowing into the gate electrode of the FET (M6) is increased bu the same amount, such that the gate-source voltage $V_{gs}$ of the FET (M6) becomes higher.

In such a case, the input voltage V2 applied at the input terminal T2 becomes relatively lower with respect to the input voltage V1, so that the gate-source voltage $V_{gs}$ of the FET (M4) becomes higher. Consequently, the currents flowing into the FET (M4, M6) are increased, so as to realize the differential amplification.

Figure 6:
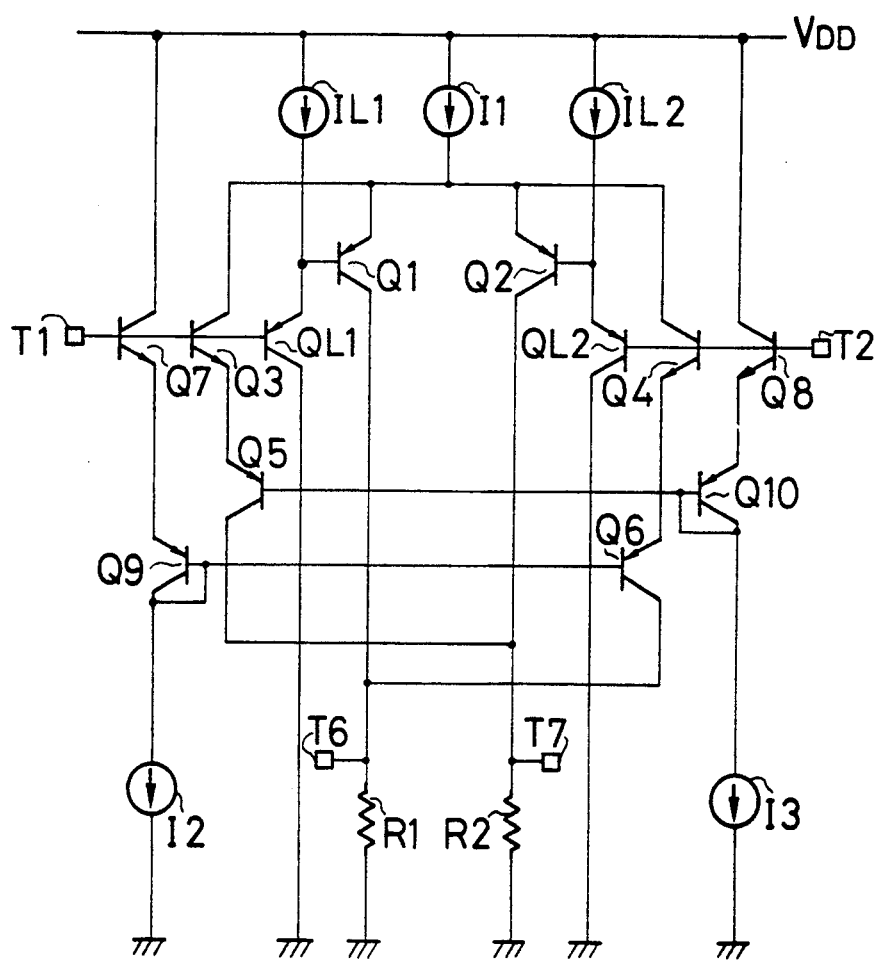
FIG. 6 is a circuit diagram of one variation of the differential amplifier circuit of FIG. 5.
Figure 7:
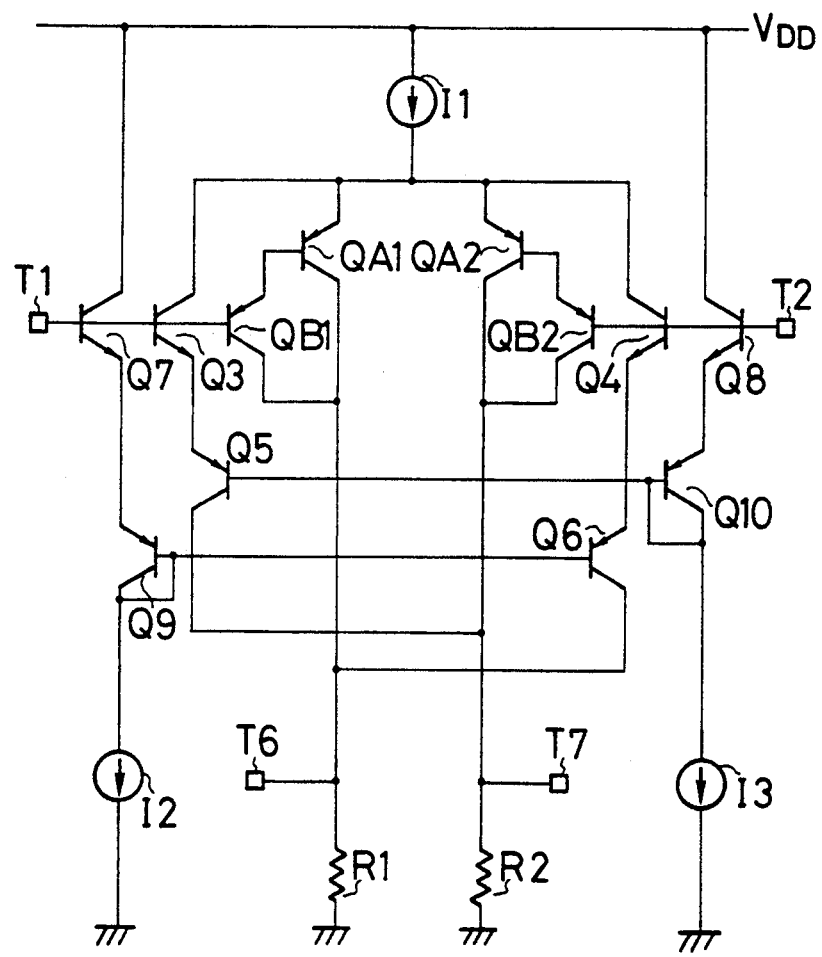
FIG. 7 is a circuit diagram of another variation of the differential amplifier circuit of FIG. 5.

Referring now to FIG. 6 and FIG. 7, variations of the above described the differential amplifier circuit of FIG. 5 will be described.

It is noted that in the configurations shown in FIG. 6 and FIG. 7, the polarity of all the elements involved are reversed from those shown in FIG. 5.

FIG. 6 shows a configuration in which the differential amplifier circuit of FIG. 5 is realized by using bipolar transistors instead of FETs. Thus, each of bipolar transistors Q1 to Q10 play the same roles as each of the FETs M1 to M10.

In addition, as shown in FIG. 6, the bipolar transistor Q1 may be equipped with a level shift circuit comprising a bipolar transistor QL1 and a current source IL1 which are connected between the input terminal T1 and the base electrode of the bipolar transistor Q1, while the bipolar transistor Q2 may be equipped with a level shift circuit comprising a bipolar transistor QL2 and a current source IL2 which are connected between the input terminal T2 and the base electrode of the bipolar transistor Q2.

In this configuration incorporating the level shift circuits for the bipolar transistors Q1 and Q2, the collector-emitter voltages in the bipolar transistors Q1 and Q2 can be maintained at sufficient levels even when the common mode input voltage $V_C$ approaches to the ground voltage level, so that the saturation of the bipolar transistors Q1 and Q2 due to the lowering of the voltage caused by the resistor loads R1 and R2 can be prevented.

FIG. 7 shows a configuration in which the differential amplifier circuit of FIG. 6 is further modified by replacing the bipolar transistors Q1 and Q2 by the Darlington connections of the bipolar transistors QA1, QB1, and QA2, QB2, respectively. In this configuration of FIG. 7, it is not desirable to incorporate the level shift circuits for the bipolar transistors Q1 and Q2 shown in FIG. 6.

Figure 8:
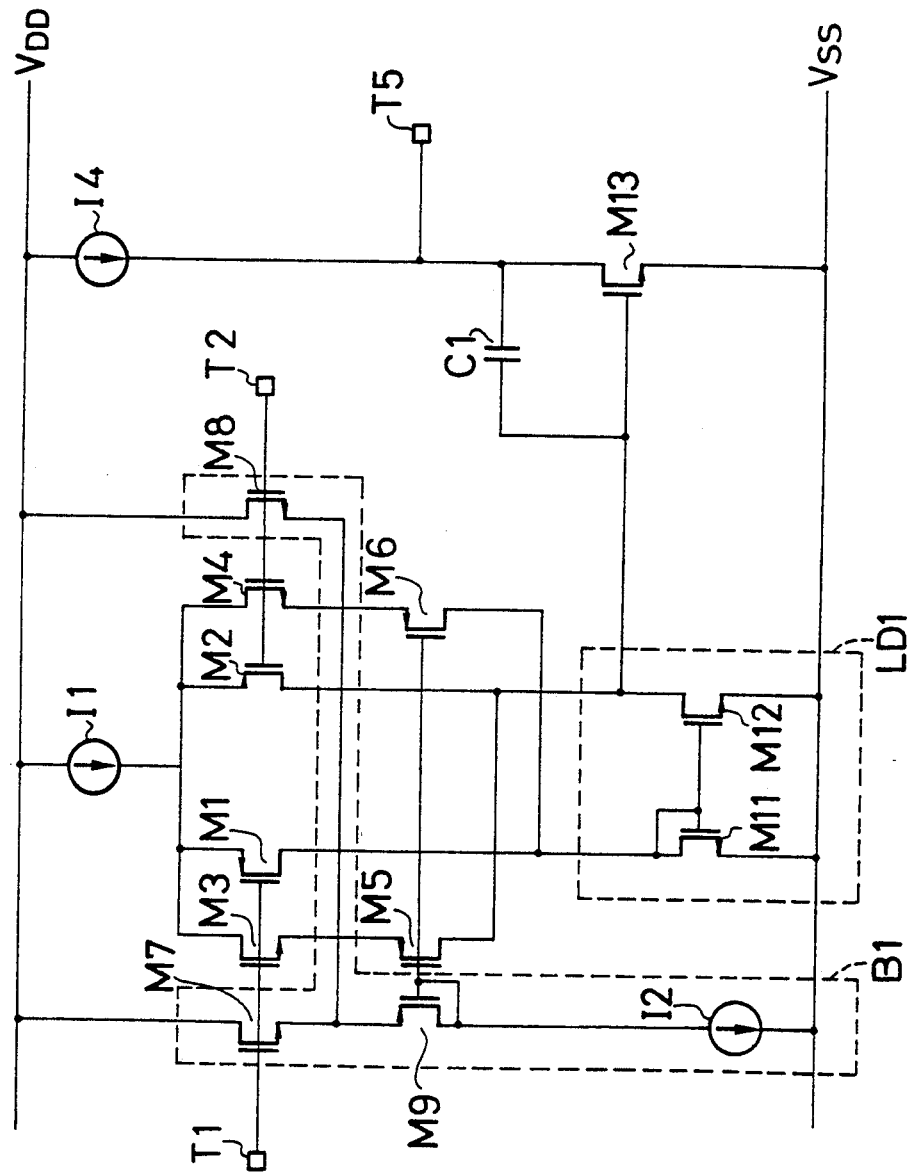
FIG. 8 is a circuit diagram of one embodiment of a two stage operational amplifier circuit using the differential input circuit configuration of FIG. 1.

Referring now to FIG. 8, one embodiment of a two stage operational amplifier circuit using the above described first embodiment of a differential input circuit shown in FIG. 1 will be described in detail.

In this operational amplifier circuit of FIG. 8, the bias circuit B1 comprises N-MOSFET (M7) having the gate electrode connected to the input terminal T1 and the drain electrode connected to the voltage source $V_{DD}$, N-MOSFET (M8) having the gate electrode connected to the input terminal T2 and the drain electrode connected to the voltage source $V_{DD}$, P-MOSFET (M9) having the source electrode connected to the source electrodes of the FETs (M7, M8) and the gate electrode connected to the gate electrodes of the FETs (M5, M6), and a current source I2 having an input side connected to the drain electrode of the FET (M9) as well as to the gate electrodes of the FETs (M5, M6) and an output side connected to the lowest voltage level $V_{SS}$.

In addition, on the output side of the differential input circuit formed by the FETs (M1 to M6), there is provided a current mirror circuit LD1 formed by FETs (M11, M12) which functions as a load.

Furthermore, there is a current source I4 connected to the voltage source $V_{DD}$, and FET (M13) having the drain electrode connected to the output of the current source I4, and the source electrode connected to the lowest voltage level $V_{SS}$, where the drain electrode of the FET (M12) in the current mirror circuit LD1 is connected with the gate electrode of the FET (M13) as well as the drain electrode of the FET (M13) through a phase compensation capacitor C1, and the output terminal T5 is also connected to the output of the current source I4.

With this configuration of FIG. 8, the higher one of the input voltages V1 and V2 applied to the input terminals T1 and T2 is level shifted and given to the gate electrodes of the FETs (M5, M6) as the bias voltage.

In this configuration of FIG. 8, the function of the operational amplifier is realized as follows.

Namely, when the input voltage V1 applied at the input terminal T1 is raised, the currents flowing into the FET (M12) side is increased while the currents flowing into the FET (M11) side is decreased. Then, as the amount of currents flowing into the FET (M12) is limited by the operation of the current mirror circuit LD1, such that the remaining currents flow into the gate electrode of the FET (M13) to raise the voltage level there. As a result, the currents from the current source I4 begin to flow through the FET (M13) so that the voltage level at the output terminal T5 is lowered.

On the other hand, when the input voltage V2 applied at the input terminal T2 is raised, the currents flowing into the FET (M11) side is increased. In such a case, the FET (M12) functions to draw the currents from the current source I4, so that the FET (M13) is put in OFF state and consequently the voltage level at the output terminal T5 is raised.

Figure 9:
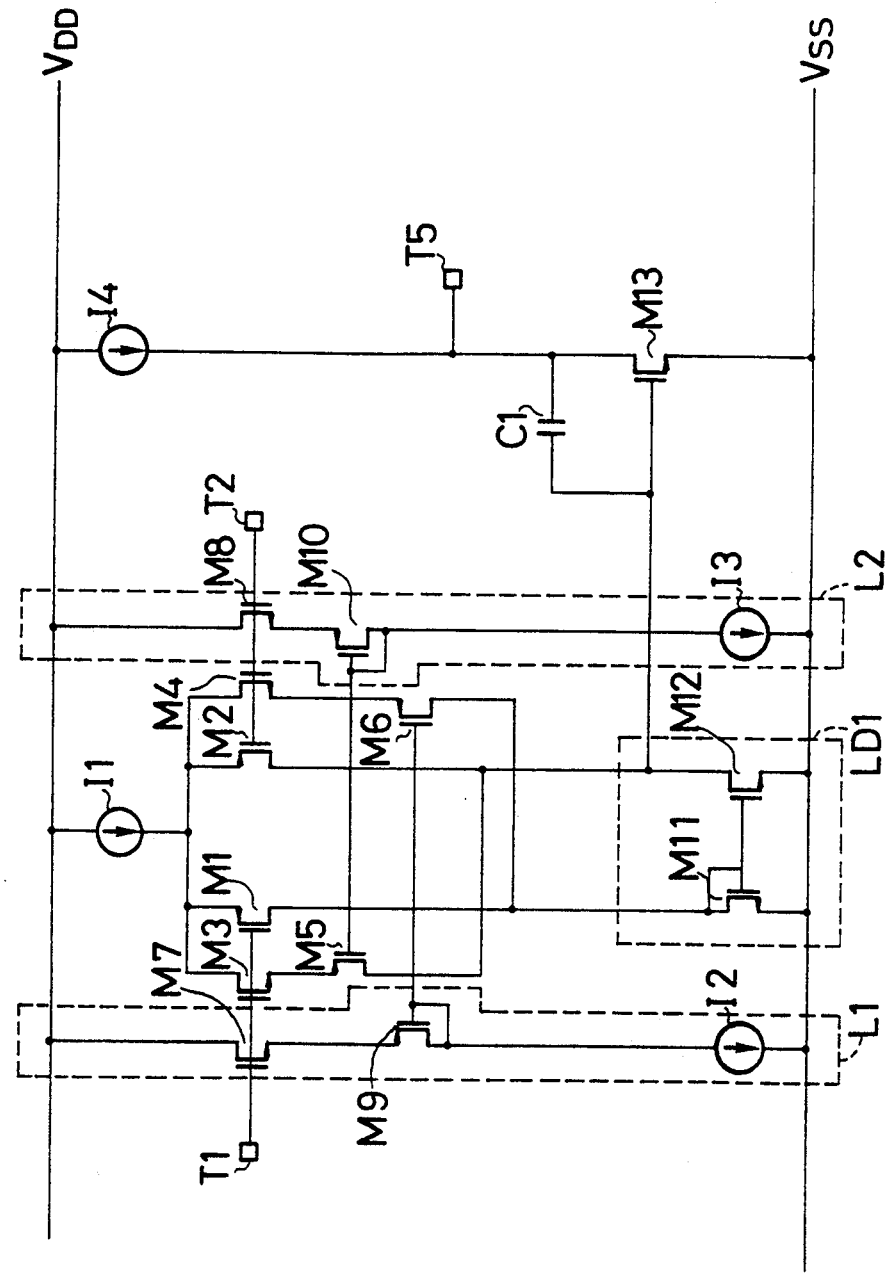
FIG. 9 is a circuit diagram of one variation of operational amplifier circuit of FIG. 8.
Figure 11:
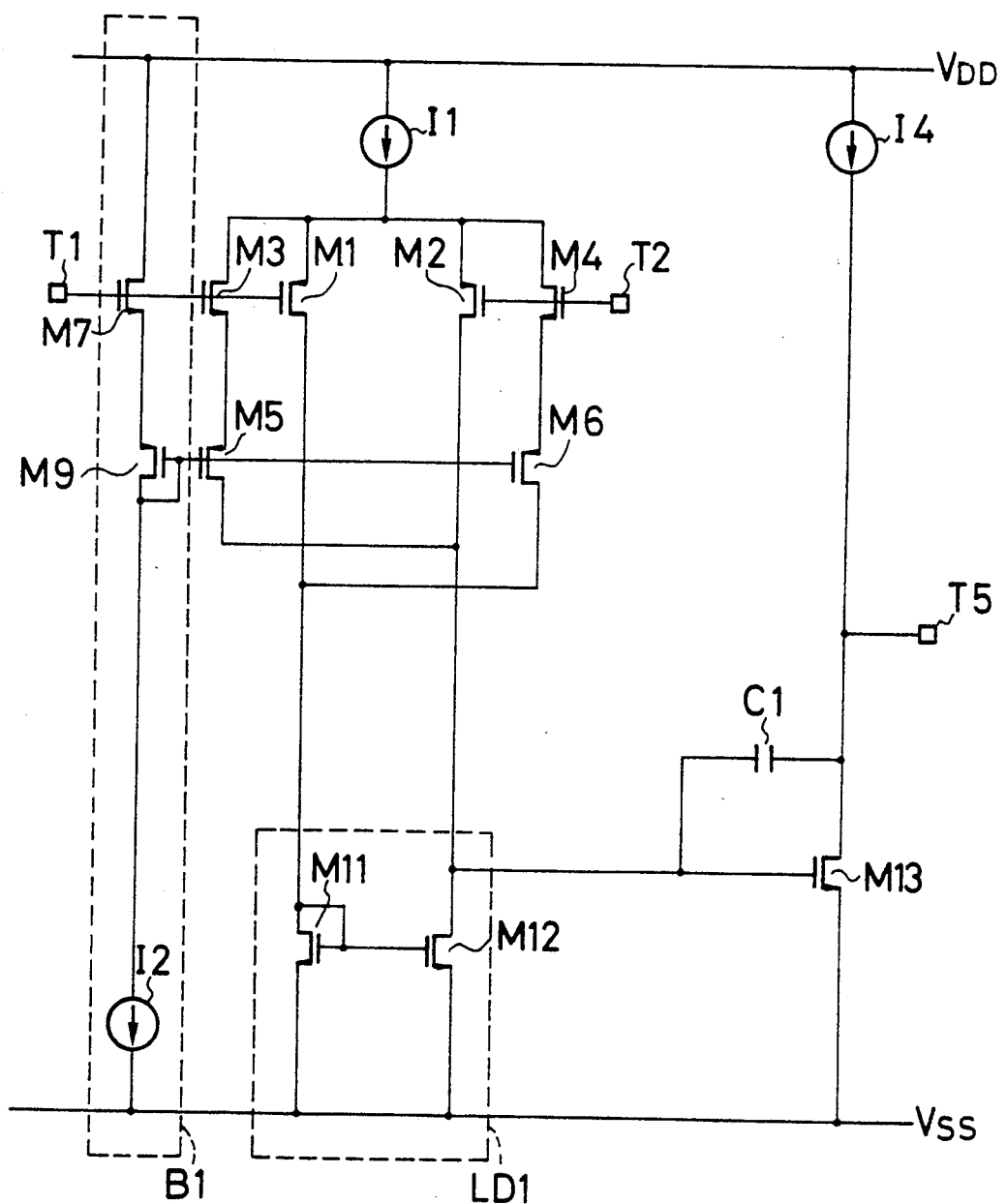
FIG. 11 is a circuit diagram of still another variation of the operational amplifier circuit of FIG. 8.

Referring now to FIG. 9 and FIG. 11, variations of the above described the operational amplifier circuit of FIG. 8 will be described.

FIG. 9 shows a configuration in which the bias circuit B1 comprises two level shift circuits L1 and L2 just as in the configuration of FIG. 2 described above, where the level shift circuit L1 in detail comprises FET (M7) having the gate electrode connected to the input terminal T1 and the drain electrode connected to the voltage source $V_{DD}$, FET (M9) having the source electrode connected to the source electrode of the FET (M7) and the gate electrode connected to the gate electrode of the FET (M6), and a current source I2 having an input side connected to the drain electrode of the FET (M9) as well as to the gate electrodes of the FET (M6) and an output side connected to the lowest voltage level $V_{SS}$, while the shift circuit L2 in detail comprises FET (M8) having the gate electrode connected to the input terminal T2 and the drain electrode connected to the voltage source $V_{DD}$, FET (M10) having the source electrode connected to the source electrode of the FET (M8) and the gate electrode connected to the gate electrode of the FET (M5), and a current source I3 having an input side connected to the drain electrode of the FET (M10) as well as to the gate electrodes of the FET (M5) and an output side connected to the lowest voltage level $V_{SS}$.

Figure 10:
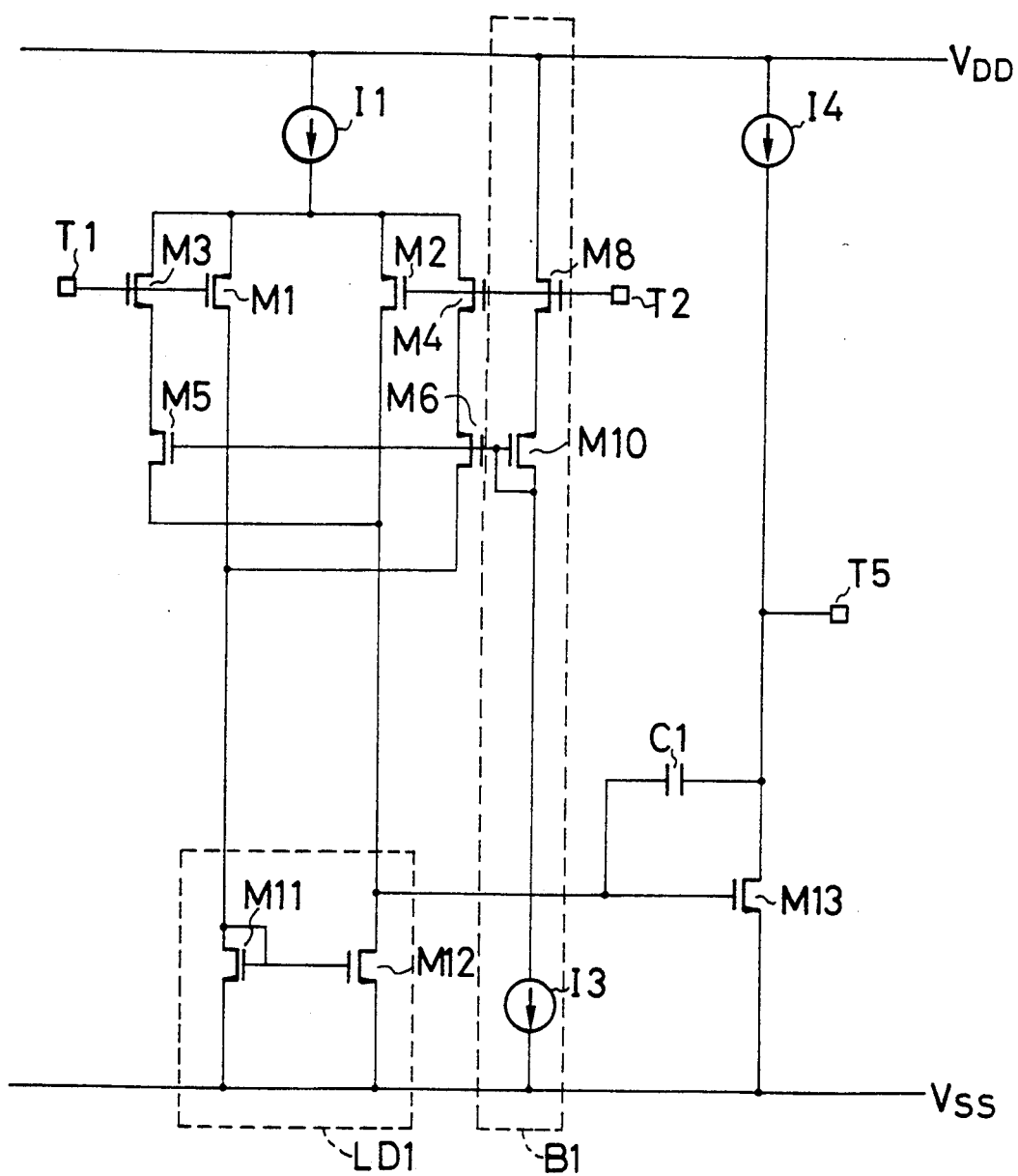
FIG. 10 is a circuit diagram of another variation of the operational amplifier circuit of FIG. 8.

FIG. 10 shows a configuration in which the bias circuit B1 comprises a level shift circuit on the input terminal T2 side just as in the configuration of FIG. 4 described above, where the bias circuit B1 in detail comprises FET (M8) having the gate electrode connected to the input terminal T2 and the drain electrode connected to the voltage source $V_{DD}$, FET (M10) having the source electrode connected to the source electrode of the FET (M8) and the gate electrode connected to the gate electrodes of the FETs (M5, M6), and a current source I3 having an input side connected to the drain electrode of the FET (M10) as well as to the gate electrode of the FET (M10) and an output side connected to the lowest voltage level $V_{SS}$.

FIG. 11 shows a configuration in which the bias circuit B1 comprises a level shift circuit on the input terminal T1 side just as in the configuration of FIG. 3 described above, where the bias circuit B1 in detail comprises FET (M7) having the gate electrode connected to the input terminal T1 and the drain electrode connected to the voltage source $V_{DD}$, FET (M9) having the source electrode connected to the source electrode of the FET (M7) and the gate electrode connected to the gate electrodes of the FETs (M5, M6), and a current source I2 having an input side connected to the drain electrode of the FET (M9) as well as to the gate electrode of the FET (M9) and an output side connected to the lowest voltage level $V_{SS}$.

Figure 12:
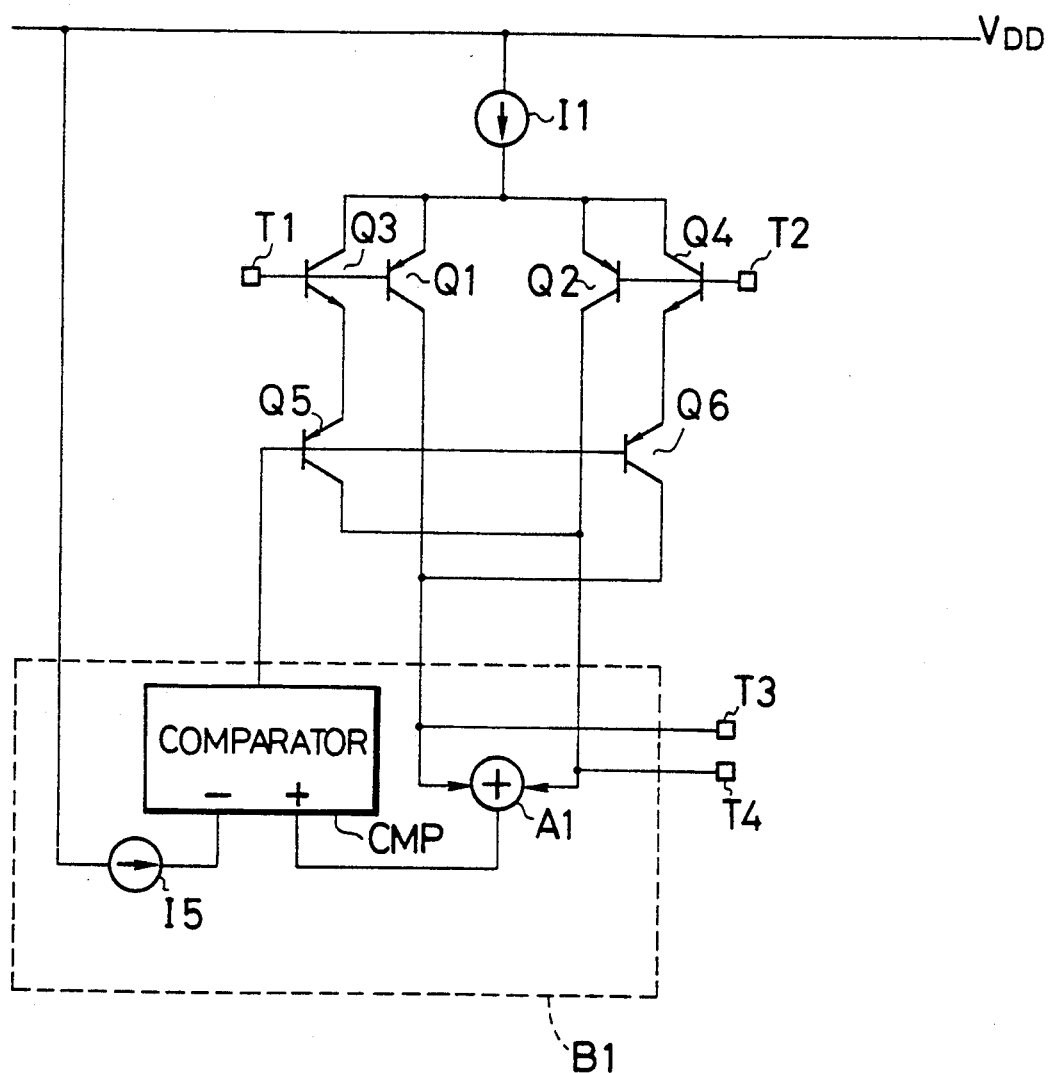
FIG. 12 is a circuit diagram of a second embodiment of a differential input circuit according to the present invention.

Referring now to FIG. 12, a second embodiment of a differential input circuit according to the present invention will be described in detail.

This configuration of FIG. 12 has a first differential pair formed by PNP transistor (Q1) and PNP transistor (Q2), and a second differential pair formed by a combination of NPN transistor (Q3) and PNP transistor (Q5) and a combination of NPN transistor (Q4) and PNP transistor (Q6), where emitter electrodes of the bipolar transistors Q3 and Q5 are connected in series and emitter electrodes of the bipolar transistors Q4 and Q6 are connected in series. These first and second differential pairs are connected in parallel, and base electrodes of the bipolar transistors Q1 and Q3 are connected to an input terminal T1 while base electrodes of the bipolar transistors Q2 and Q4 are connected to another input terminal T2, and collector electrodes of the bipolar transistors Q1 and Q6 are connected to an output terminal T3 while collector electrodes of the bipolar transistors Q2 and Q5 are connected to another output terminal T4.

In this configuration, a current source I1 is connected to a voltage source $V_{DD}$, and an output of this current source I1 is connected to emitter electrodes of bipolar transistors Q1 and Q2, as well as to collector electrodes of bipolar transistors Q3 and Q4.

In addition, there is provided a bias circuit B1 comprising: a current source I5 connected to the voltage source $V_{DD}$; an adder A1 for adding the output voltages at the output terminals T3 and T4; and a comparator CMP for receiving the output of the current source I5 at a plus input terminal and the output of the adder A1 at a minus input terminal and outputting the bias voltage $V_b$ to the base electrodes of the bipolar transistors Q5 and Q6. Thus, in this bias circuit B1, the bias voltage $V_b$ is derived from the output voltages at the output terminals T3 and T4.

Here, the amount of currents produced by the current source I5 is set to be slightly smaller than that produced by the current source I1. Also, the bias voltage $V_b$ should have such a magnitude that, when the input voltages V1 and V2 applied at the input terminals T1 and T2 are balanced so that a half of the output currents from the current source I1 is distributed to the bipolar transistors (Q3, Q5) side and a remaining half of the output currents from the current source I1 is distributed to the bipolar transistors (Q4, Q6) side, the sum of the base-emitter voltages $V_{be}$ of the bipolar transistors (Q3, Q5) or (Q4, Q6) are over the minimum required DC level for the second differential pair to operate.

In this configuration, the collector electrode of the bipolar transistor (Q5) is connected to the output terminal T4 while the collector electrode of the bipolar transistor (Q6) is connected to the output terminal T3, so as to have the identical current direction in the first and the second differential pairs.

Now, the operation of this differential input circuit will be described.

In this configuration of FIG. 12, the first differential pair formed by the bipolar transistors Q1 and Q2 operates as the usual differential circuit for the common mode input voltage $V_C$ up to $V_{DD} - |V_{be}|$. In this range of the common mode input voltage $V_C$, the total amount of the currents inputted into the adder A1 of the bias circuit B1 is equal to the amount of currents produced by the current source I1, so that the output of the comparator CMP is a high positive voltage close to $V_{DD}$ because I1>I5. As a consequence, the bipolar transistors Q5 and Q6 are put in OFF states, and only the bipolar transistors Q1 and Q2 of the first transistor pair are operable.

Then, when the common mode input voltage $V_C$ is raised beyond $V_{DD} - |V_{be}|$, both of the bipolar transistors Q1 and Q2 of the first transistor pair are put in OFF states. As a result, the total amount of the currents inputted into the adder A1 of the bias circuit B1 rapidly decreases, so that the output of the comparator CMP approaches to the lowest voltage level Vss. As a consequence, the bipolar transistors Q5 and Q6 are put in ON states, such that the second differential pair formed by the bipolar transistors Q3, Q5 and Q4, Q6 operates as the differential circuit.

In this configuration, in either one of the above described cases, the currents are supplied only from the single current source I1, so that the sum of the output currents from the first and second differential pairs is a constant, and therefore there is no variation in the output levels.

Thus, in this configuration of FIG. 12, even when the bipolar transistors (Q1, Q2) of the first differential pair are in OFF states as the input voltages V1 and V2 at the input terminals T1 and T2 become higher, the bipolar transistors (Q3, Q4, Q5, Q6) of the second differential pair are operable, so that the wider common mode input voltage range can be realized.

Furthermore, since the first and second differential pairs have the identical output current direction, there is no need for a current summing circuit for summing two oppositely directed output currents in this configuration.

Consequently, this configuration involves a reduced number of circuit components, and therefore it is possible in this configuration to have a compact circuit size and to be less expensive.

It is to be noted that all or a part of the bipolar transistors used in this configuration of FIG. 12 may be replaced by FET type transistors, if desired.

Figure 13:
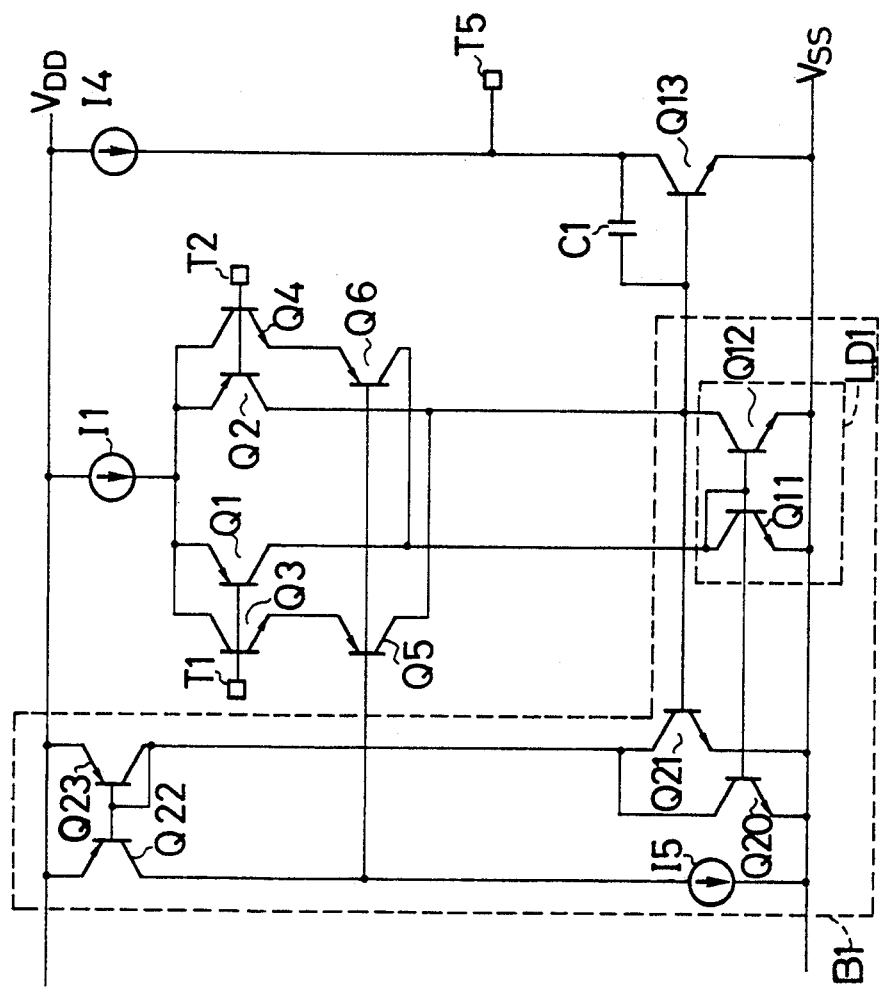
FIG. 13 is a circuit diagram of one embodiment of a two stage operational amplifier circuit using the differential input circuit configuration of FIG. 12.

Referring now to FIG. 13, one embodiment of a two stage operational amplifier circuit using the above described second embodiment of a differential input circuit shown in FIG. 12 will be described in detail.

In this configuration of FIG. 13, on the output side of the differential input circuit formed by the bipolar transistors Q1 to Q6, there is provided a current mirror circuit LD1 formed by bipolar transistors Q11 and Q12 which functions as a load for the first stage of the operational amplifier, and which also converts the output currents of the differential input circuit into the voltages.

In addition, there are bipolar transistors Q20 and Q21 for carrying out the voltage to current conversion, where the bipolar transistor Q20 has the base electrode connected to the base electrodes of the bipolar transistors Q11 and Q12, the emitter electrode connected to the lowest voltage level $V_{SS}$, and the collector electrode connected to the collector electrode of the bipolar transistor Q21, while the bipolar transistor Q21 has the base electrode connected to the collector electrode of the bipolar transistor Q12, and the emitter electrode connected to the lowest voltage level $V_{SS}$. These bipolar transistors Q20 and Q21 and the current mirror circuit LD1 together form the adder A1 in the configuration shown in FIG. 12.

Furthermore, there is a current mirror circuit formed by bipolar transistors Q22 and Q23 which mirrors the output currents of the adder configuration formed by the bipolar transistors Q20 and Q21 and the current mirror circuit LD1, and compares them with the output currents of the current source I5.

When the output currents of the current source I5 are smaller, the output voltage of the bias circuit B1 becomes higher, so that the bipolar transistors Q5 and Q6 are put in OFF states. On the other hand, when the output currents of the current source I5 are larger, the output voltage of the bias circuit B1 is lowered and the bipolar transistors Q5 and Q6 are put in ON states. As a result, the second differential pair formed by the bipolar transistors Q3, Q5 and Q4, Q6 operates as the differential circuit.

Moreover, there is a current source I4 connected to the voltage source $V_{DD}$, and bipolar transistor Q13 having the collector electrode connected to the output of the current source I4, and the source electrode connected to the lowest voltage level $V_{SS}$, where the collector electrode of the bipolar transistor Q12 in the current mirror circuit LD1 is connected with the base electrode of the bipolar transistor Q13 as well as the collector electrode of the bipolar transistor Q13 through a phase compensation capacitor C1, and the output terminal T5 is also connected to the output of the current source I4, so as to form an output stage of the operational amplifier, just as in the configuration of FIG. 8 described above.

Figure 14:
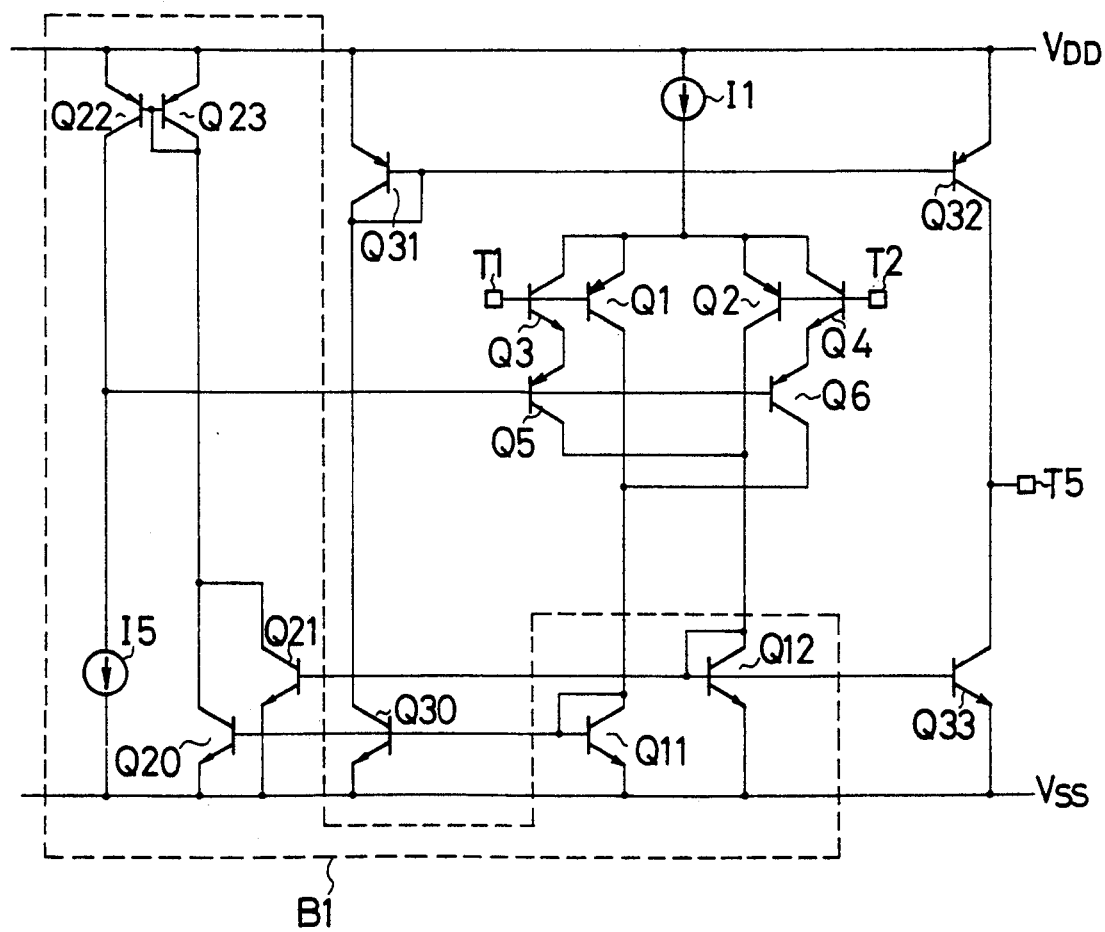
FIG. 14 is a circuit diagram of one embodiment of a single stage operational amplifier circuit using the differential input circuit configuration of FIG. 12.
Figure 15:
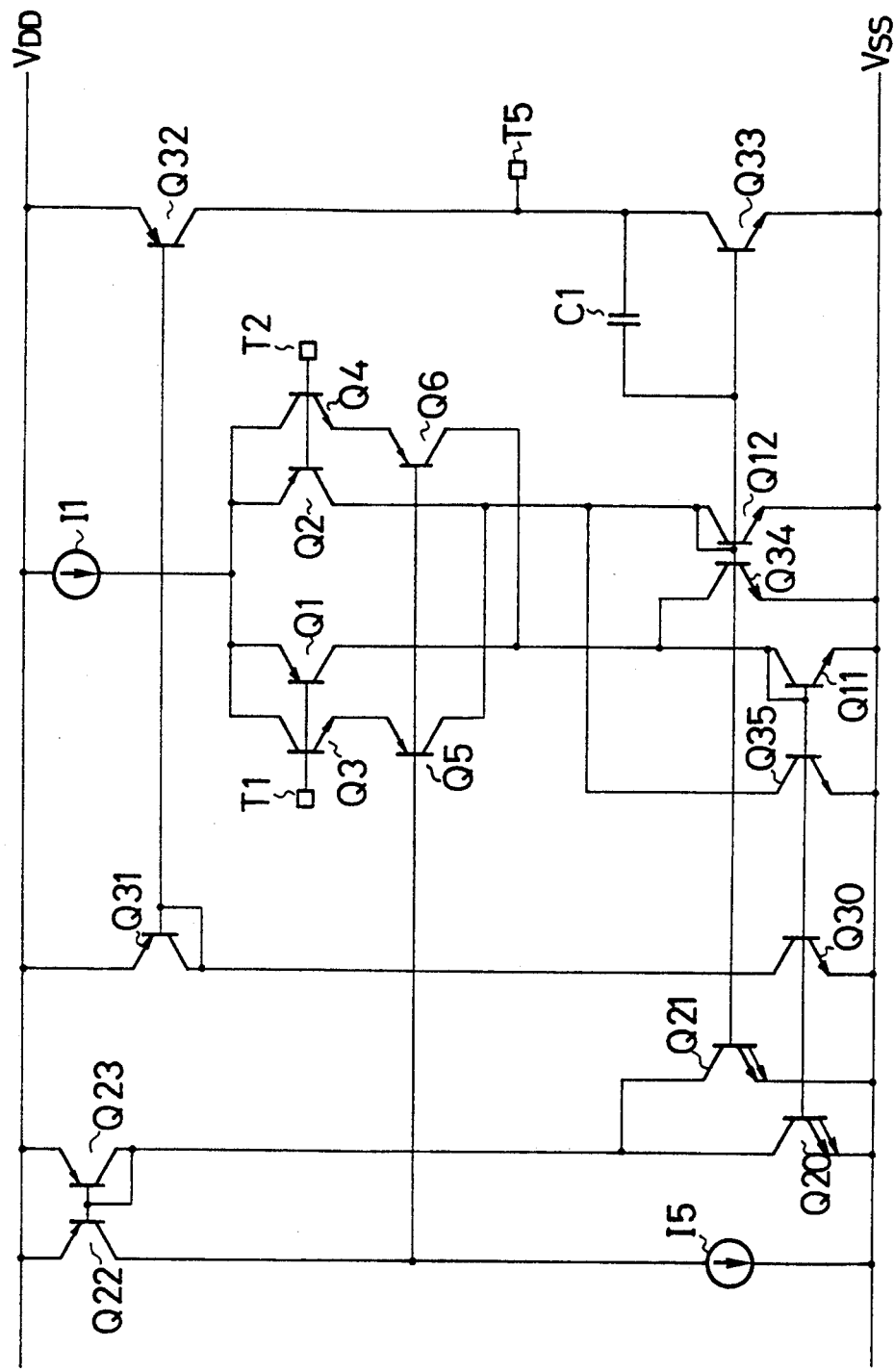
FIG. 15 is a circuit diagram of one embodiment of a two stage operational amplifier circuit with positive feedback using the differential input circuit configuration of FIG. 12.

Referring now to FIG. 14 and FIG. 15, variations of the above described the differential amplifier circuit of FIG. 13 will be described.

FIG. 14 shows a configuration in which the two stage operational amplifier circuit configuration of FIG. 13 is modified into a single stage operational amplifier circuit.

In this configuration of FIG. 14, the bipolar transistors Q11 and Q12 provided on the output side of the differential input circuit formed by the bipolar transistors Q1 to Q6 are utilized in forming an output stage of the operational amplifier in conjunction with the bipolar transistors Q30 to Q33, while they also have the functions to convert the output currents of the differential input circuit into the voltages and to form the adder A1 in the configuration shown in FIG. 12 in conjunction with the bipolar transistors Q20 and Q21 just as in the configuration of FIG. 13 described above, such that the appropriate bias voltage can be given to the base electrodes of the bipolar transistors Q5 and Q6.

Here, as shown in FIG. 14, the bipolar transistors Q30 to Q33 to form the output stage of the operational amplifier along with the bipolar transistors Q11 and Q12 are provided in such a manner that the bipolar transistor Q30 has the base electrode connected to the base and collector electrodes of the bipolar transistor Q11, and the emitter electrode connected to the lowest voltage level $V_{SS}$, the bipolar transistor Q31 has the collector and base electrodes connected to the collector electrode of the bipolar transistor Q30, and the emitter electrode connected to the voltage source $V_{DD}$, the bipolar transistor Q32 has the base electrode connected to the base and collector electrodes of the bipolar transistor Q31, and the emitter electrode connected to the voltage source $V_{DD}$, and the bipolar transistor Q33 has the collector electrode connected to the collector electrode of the bipolar transistor Q32, the base electrode connected to the base electrode of the bipolar transistor Q12, and the emitter electrode connected to the lowest voltage level $V_{SS}$.

Thus, in this configuration of FIG. 14, the current mirror circuit formed by the bipolar transistors Q11 and Q12 plays a role in the addition of the currents as a part of the adder A1 as well as a role in the output stage of the operational amplifier.

FIG. 15 shows a configuration in which the two stage operational amplifier circuit configuration of FIG. 13 is modified into a two stage operational amplifier circuit with positive feedback.

Namely, in this configuration of FIG. 15, the bipolar transistors Q11 and Q12 of the current mirror circuit provided on the output side of the differential input circuit formed by the bipolar transistors Q1 to Q6 are utilized in forming positive feedback loads of the operational amplifier in conjunction with the bipolar transistors Q34 and Q35, while they also have the functions to convert the output currents of the differential input circuit into the voltages and to form the adder A1 in the configuration shown in FIG. 12 in conjunction with the bipolar transistors Q20 and Q21 just as in the configuration of FIG. 13 described above, such that the appropriate bias voltage can be given to the base electrodes of the bipolar transistors Q5 and Q6.

Here, as shown in FIG. 15, the bipolar transistors Q34 and Q35 to form the positive feedback loads of the operational amplifier along with the bipolar transistors Q11 and Q12 are provided in such a manner that the bipolar transistor Q34 has the base electrode connected to the base electrode of the bipolar transistor Q12, the collector electrode connected to the collector electrode of the bipolar transistor Q11, and the emitter electrode connected to the lowest voltage level $V_{SS}$, while the bipolar transistor Q35 has the base electrode connected to the base electrode of the bipolar transistor Q11, the collector electrode connected to the collector electrode of the bipolar transistor Q12, and the emitter electrode connected to the lowest voltage level $V_{SS}$.

Figure 16:
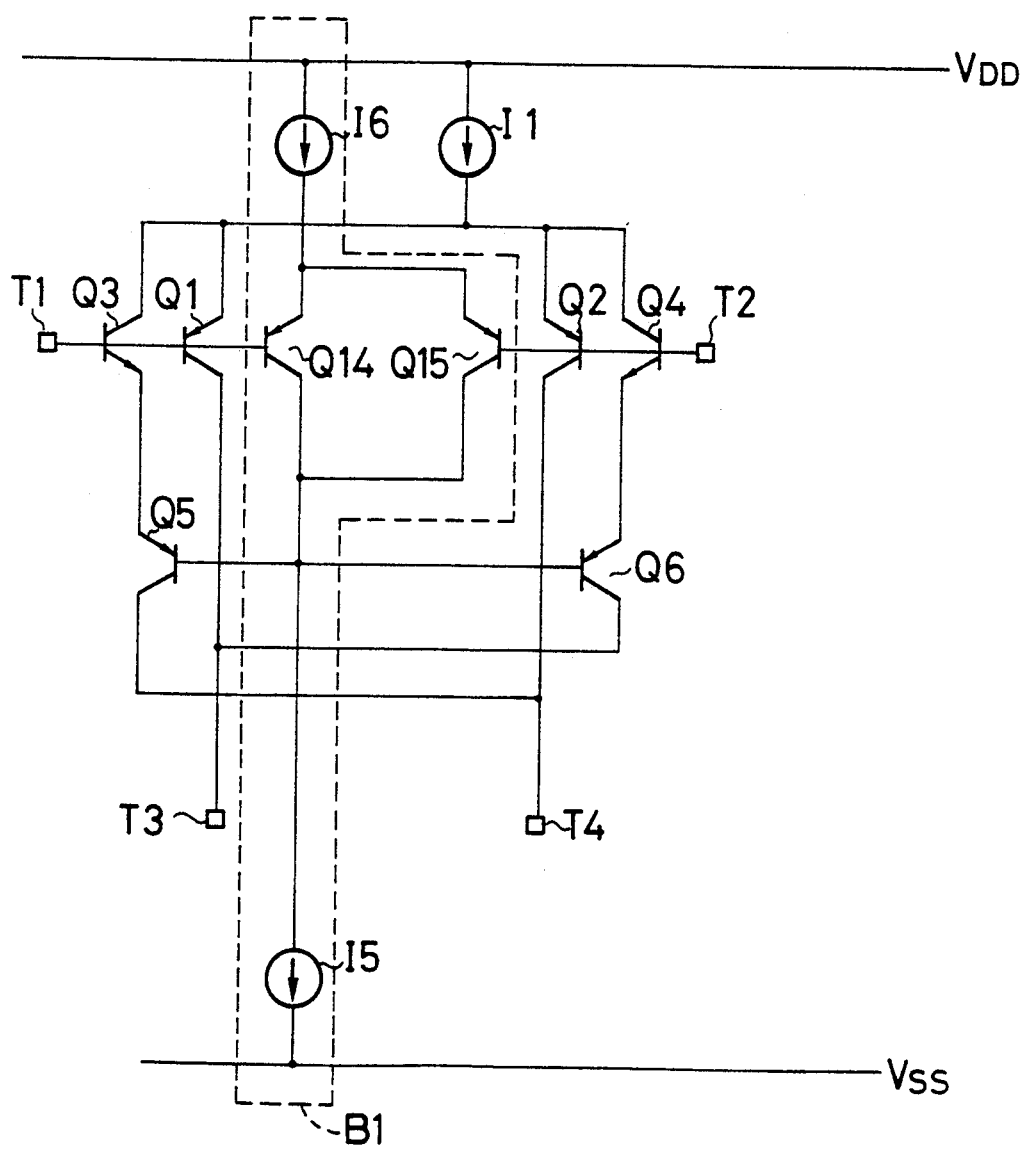
FIG. 16 is a circuit diagram of a third embodiment of a differential input circuit according to the present invention.

Referring now to FIG. 16, a third embodiment of a differential input circuit according to the present invention will be described in detail.

This configuration of FIG. 16 has a first differential pair formed by PNP transistor (Q1) and PNP transistor (Q2), and a second differential pair formed by a combination of NPN transistor (Q3) and PNP transistor (Q5) and a combination of NPN transistor (Q4) and PNP transistor (Q6), where emitter electrodes of the bipolar transistors Q3 and Q5 are connected in series and emitter electrodes of the bipolar transistors Q4 and Q6 are connected in series. These first and second differential pairs are connected in parallel, and base electrodes of the bipolar transistors Q1 and Q3 are connected to an input terminal T1 while base electrodes of the bipolar transistors Q2 and Q4 are connected to another input terminal T2, and collector electrodes of the bipolar transistors Q1 and Q6 are connected to an output terminal T3 while collector electrodes of the bipolar transistors Q2 and Q5 are connected to another output terminal T4.

In this configuration, a current source I1 is connected to a voltage source $V_{DD}$, and an output of this current source I1 is connected to emitter electrodes of bipolar transistors Q1 and Q2, as well as to collector electrodes of bipolar transistors Q3 and Q4.

Also, in this configuration, the collector electrode of the bipolar transistor (Q5) is connected to the output terminal T4 while the collector electrode of the bipolar transistor (Q6) is connected to the output terminal T3, so as to have the identical current direction in the first and the second differential pairs.

In addition, there is provided a bias circuit B1 comprising: a dummy differential pair formed by bipolar transistors Q14 and Q15 having the base electrodes connected to the input terminals T1 and T2, respectively, which functions to monitor the operation of the first differential pair formed by the bipolar transistors Q1 and Q2; a dummy current source I6 for supplying the same amount of currents to the dummy differential pair as the current source I1 supplies to the first differential pair, which is connected between the voltage source $V_{DD}$ and the emitter electrodes of the bipolar transistors Q14 and Q15; and a reference current source I5 connected between the lowest voltage level $V_{SS}$ and the collector electrodes of the bipolar transistors Q14 and Q15. In this bias circuit, the collector voltage level of the bipolar transistors Q14 and Q15 obtained by comparing a sum of the collector currents of the bipolar transistors Q14 and Q15 with the currents from the reference current source I5 is given to the base electrodes of the bipolar transistors Q5 and Q6 as the bias voltage.

In this configuration of FIG. 16, when the bipolar transistors Q1 and Q2 of the first differential pair are operating, the bipolar transistors Q14 and Q15 of the dummy differential pair are also operating, such that the sum of the collector currents of the bipolar transistors Q14 and Q15 becomes equal to the currents supplied by the dummy current source I6, which is also equal to the currents supplied by the current source I1. As a result, because of the difference between the sum of the collector currents of the bipolar transistors Q14 and Q15 with respect to the currents from the reference current source I5, the base voltage level of the bipolar transistors Q5 and Q6 is raised, such that the bipolar transistors Q5 and Q6 are put in OFF states.

On the other hand, when the bipolar transistors Q1 and Q2 of the first differential pair are put in OFF states, the bipolar transistors Q14 and Q15 of the dummy differential pair are also put in OFF states, such that the sum of the collector currents of the bipolar transistors Q14 and Q15 becomes nearly zero. As a result, the base voltage level of the bipolar transistors Q5 and Q6 is lowered, such that the bipolar transistors Q5 and Q6 are put in ON states, and consequently, the second differential pair formed by the bipolar transistors Q3, Q5 and Q4 and Q6 begins to operate as the differential circuit.

In this configuration, in either one of the above described cases, the currents are supplied to the first and second differential pairs only from the single current source I1, so that the sum of the output currents from the first and second differential pairs is a constant, and therefore there is no variation in the output levels.

Thus, in this configuration of FIG. 16, even when the bipolar transistors (Q1, Q2) of the first differential pair are in OFF states as the input voltages V1 and V2 at the input terminals T1 and T2 become higher, the bipolar transistors (Q3, Q4, Q5, Q6) of the second differential pair are operable, so that the wider common mode input voltage range can be realized.

Furthermore, since the first and second differential pairs have the identical current direction, there is no need for a current summing circuit for summing two oppositely directed output currents in this configuration.

Consequently, this configuration involves a reduced number of circuit components, and therefore it is possible in this configuration to have a compact circuit size and to be less expensive.

It is to be noted that all or a part of the bipolar transistors used in this configuration of FIG. 16 may be replaced by FET type transistors, if desired.

Figure 17:
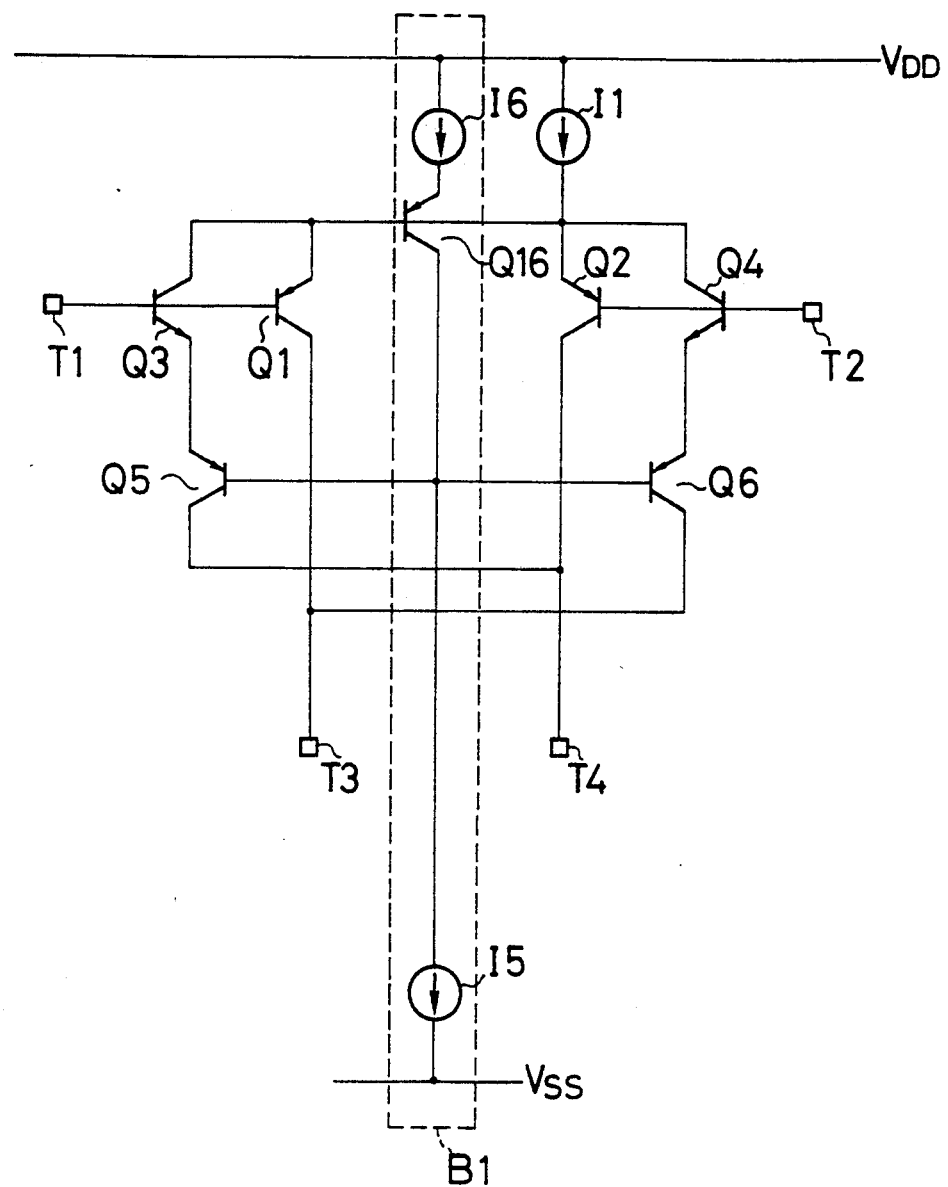
FIG. 17 is a circuit diagram of a fourth embodiment of a differential input circuit according to the present invention.

Referring now to FIG. 17, a fourth embodiment of a differential input circuit according to the present invention will be described in detail.

This fourth embodiment of FIG. 17 differs from the third embodiment of FIG. 16 described above in the detail configuration of the bias circuit B1, such that the bias circuit B1 now comprises: a bipolar transistor Q16 having the base electrode connected to the emitter electrodes of the bipolar transistors Q1 and Q2 of the first differential pair, which functions to monitor the operation of the first differential pair formed by the bipolar transistors Q1 and Q2; a current source I6 for supplying the same amount of currents to the bipolar transistor Q16 as the current source I1 supplies to the first differential pair, which is connected between the voltage source $V_{DD}$ and the emitter electrode of the bipolar transistor Q16; and a reference current source I5 connected between the lowest voltage level $V_{SS}$ and the collector electrode of the bipolar transistor Q16. In this bias circuit, the collector currents of the bipolar transistor Q16 is compared with the currents from the reference current source I5 in order to determine the bias voltage to be given to the base electrodes of the bipolar transistors Q5 and Q6. With this configuration of FIG. 17, the bias circuit B1 operates similarly to that shown in FIG. 16 described above.

Thus, in this configuration, just as in the third embodiment of FIG. 16, the currents are supplied to the first and second differential pairs only from the single current source I1, so that the sum of the output currents from the first and second differential pairs is a constant, and therefore there is no variation in the output levels.

Also, in this configuration of FIG. 17, even when the bipolar transistors (Q1, Q2) of the first differential pair are in OFF states as the input voltages V1 and V2 at the input terminals T1 and T2 become higher, the bipolar transistors (Q3, Q4, Q5, Q6) of the second differential pair are operable, so that the wider common mode input voltage range can be realized.

Furthermore, since the first and second differential pairs have the identical current direction, there is no need for a current summing circuit for summing two oppositely directed output currents in this configuration.

Consequently, this configuration involves a reduced number of circuit components, and therefore it is possible in this configuration to have a compact circuit size and to be less expensive.

It is to be noted that all or a part of the bipolar transistors used in this configuration of FIG. 17 may be replaced by FET type transistors, if desired.

It is to be noted that many modifications and variations of the above embodiments may be made without departing from the novel and advantageous features of the present invention. Accordingly, all such modifications and variations are intended to be included within the scope of the appended claims.

What is claimed is:

1. A differential input circuit, comprising:
   a first differential pair formed by first and second FET type transistors connected to a current source, said first and second FET type transistors having gate electrodes for receiving voltages corresponding to input voltages applied to first and second input terminals, respectively, and connected to first and second output terminals, respectively;
   a second differential pair formed by first and second FET type transistor combinations, each of the first and second FET type transistor combination comprising two FET type transistors of mutually complementary conductivity types having source electrodes connected to each other, said second differential pair being connected to the current source in parallel to the first differential pair, and one of said two FET type transistors of the first and second FET type transistor combinations which has a different conductivity type from the FET type transistors of the first differential pair has a gate electrode for receiving the voltages corresponding to the input voltages applied to the first and second input terminals, respectively, while another one of said two FET type transistors of the first and second FET type transistor combinations which has an identical conductivity type as the FET type transistors of the first differential pair is connected to the second and first output terminals, respectively; and a bias circuit for deriving and supplying bias voltages to a gate electrode of one of said two FET type transistors of each of the first and second FET type transistor combinations in the second differential pair which has an identical conductivity type to the FET type transistors of the first differential pair.

2. The differential input circuit of claim 1, wherein the first differential pair comprises:

the first FET type transistor having a source electrode connected to the current source, a gate electrode connected to a first input terminal, and a drain electrode connected to a first output terminal; and the second FET type transistor having a source electrode connected to the current source, a gate electrode connected to a second input terminal, and a drain electrode connected to a second output terminal; and wherein the second differential pair comprises:

the first FET type transistor combination, further comprising:

a third FET type transistor having a gate electrode connected to the first input terminal, and a drain electrode connected to the current source; and a fifth FET type transistor having a source electrode connected to a source electrode of the third FET type transistor, a gate electrode connected to the bias circuit, and a drain electrode connected to the second output terminal; and the second FET type transistor combination, further comprising:

a fourth FET type transistor having a gate electrode connected to the second input terminal, and a drain electrode connected to the current source; and a sixth FET type transistor having a source electrode connected to a source electrode of the fourth FET type transistor, a gate electrode connected to the bias circuit, and a drain electrode connected to the first output terminal.

3. The differential input circuit of claim 1, wherein the bias circuit derives the bias voltages according to the input voltages.

4. The differential input circuit of claim 3, wherein the bias circuit further comprises:

a first level shift circuit for deriving the bias voltages to be supplied to a gate electrode of one of said two FET type transistors of one of the first and second FET type transistor combinations in the second differential pair which has an identical conductivity type as the FET type transistors of the first differential pair, by level shifting the input voltages applied to the first input terminal; and a second level shift circuit for deriving the bias voltages to be supplied to a gate electrode of one of said two FET type transistors of another one of the first and second FET type transistor combinations in the second differential pair which has an identical conductivity type as the FET type transistors of the first differential pair, by level shifting the input voltages applied to the second input terminal.

5. The differential input circuit of claim 3, wherein the bias circuit further comprises a level shift circuit for deriving the bias voltages to be supplied to a gate electrode of one of said two FET type transistors of each of the first and second FET type transistor combinations in the second differential pair which has an identical conductivity type as the FET type transistors of the first differential pair, by level shifting the input voltages applied to one of the first and second input terminals.

6. The differential input circuit of claim 1, wherein the bias circuit derives the bias voltages according to outputs at the first and second output terminals.

7. The differential input circuit of claim 6, wherein the bias circuit further comprises:

adder means for adding outputs at the first and second output terminals;

reference current source for supplying reference currents slightly smaller than currents supplied by the current source; and comparator means for comparing outputs of the adder means and the reference current source, and supplying the bias voltages corresponding to a difference between the outputs of the adder means and the reference current source.

8. The differential input circuit of claim 1, wherein the bias circuit derives the bias voltages according to operations of the first differential pair.

9. The differential input circuit of claim 8, wherein the bias circuit further comprises:

a dummy differential pair formed by first and second dummy FET type transistors connected to a dummy current source, said first and second dummy FET type transistors having gate electrodes for receiving the voltages corresponding to the input voltages applied to the first and second input terminals, respectively; and a reference current source connected to the first and second dummy FET type transistors, such that the bias voltages are obtained as differences of currents supplied from the reference current source and a sum of outputs of the first and second dummy FET type transistors.

10. The differential input circuit of claim 8, wherein the bias circuit further comprises:

a monitoring FET type transistor connected to a dummy current source, and having a gate electrode connected to source electrodes of the first and second FET type transistors in the first differential pair; and a reference current source connected to the monitoring FET type transistor, such that the bias voltages are obtained as differences of currents supplied from the reference current source and collector currents of the monitoring FET type transistor.

11. A differential input circuit, comprising:

a first differential pair formed by first and second bipolar transistors connected to a current source, said first and second bipolar transistors having base electrodes for receiving voltages corresponding to input voltages applied to first and second input terminals, respectively, and connected to first and second output terminals, respectively;

a second differential pair formed by first and second bipolar transistor combinations, each of the first and second bipolar transistor combination comprising two bipolar transistors of mutually complementary polarity types having emitter electrodes connected to each other, said second differential pair being connected to the current source in parallel to the first differential pair, and one of said two bipolar transistors of the first and second bipolar transistor combinations which has a different polarity type from the bipolar transistors of the first differential pair has a base electrode for receiving the voltages corresponding to the input voltages applied to the first and second input terminals, respectively, while another one of said two bipolar transistors of the first and second bipolar transistor combinations which has an identical polarity type as the bipolar transistors of the first differential pair is connected to the second and first output terminals, respectively; and a bias circuit for deriving and supplying bias voltages to a base electrode of one of said two bipolar transistors of each of the first and second bipolar transistor combinations in the second differential pair which has an identical polarity type to the bipolar transistors of the first differential pair.

12. The differential input circuit of claim 11, wherein the first differential pair comprises:

the first bipolar transistor having an emitter electrode connected to the current source, a base electrode connected to a first input terminal, and a collector electrode connected to a first output terminal; and the second bipolar transistor having an emitter electrode connected to the current source, a base electrode connected to a second input terminal, and a collector electrode connected to a second output terminal; and wherein the second differential pair comprises:

the first bipolar transistor combination, further comprising:
   a third bipolar transistor having a base electrode connected to the first input terminal, and a collector electrode connected to the current source; and
   a fifth bipolar transistor having an emitter electrode connected to an emitter electrode of the third bipolar transistor, a base electrode connected to the bias circuit, and a collector electrode connected to the second output terminal; and the second bipolar transistor combination, further comprising:
   a fourth bipolar transistor having a base electrode connected to the second input terminal, and a collector electrode connected to the current source; and
   a sixth bipolar transistor having an emitter electrode connected to an emitter electrode of the fourth bipolar transistor, a base electrode connected to the bias circuit, and a collector electrode connected to the first output terminal.

13. The differential input circuit of claim 11, wherein the bias circuit derives the bias voltages according to the input voltages.

14. The differential input circuit of claim 13, wherein the bias circuit further comprises:

a first level shift circuit for deriving the bias voltages to be supplied to a base electrode of one of said two bipolar transistors of one of the first and second bipolar transistor combinations in the second differential pair which has an identical polarity type as the bipolar transistors of the first differential pair, by level shifting the input voltages applied to the first input terminal; and a second level shift circuit for deriving the bias voltages to be supplied to a base electrode of one of said two bipolar transistors of another one of the first and second bipolar transistor combinations in the second differential pair which has an identical polarity type as the bipolar transistors of the first differential pair, by level shifting the input voltages applied to the second input terminal.

15. The differential input circuit of claim 13, wherein the bias circuit further comprises a level shift circuit for deriving the bias voltages to be supplied to a base electrode of one of said two bipolar transistors of each of the first and second bipolar transistor combinations in the second differential pair which has an identical polarity type as the bipolar transistors of the first differential pair, by level shifting the input voltages applied to one of the first and second input terminals.

16. The differential input circuit of claim 11, wherein the bias circuit derives the bias voltages according to outputs at the first and second output terminals.

17. The differential input circuit of claim 16, wherein the bias circuit further comprises:

adder means for adding outputs at the first and second output terminals;

reference current source for supplying reference currents slightly smaller than currents supplied by the current source; and comparator means for comparing outputs of the adder means and the reference current source, and supplying the bias voltages corresponding to a difference between the outputs of the adder means and the reference current source.

18. The differential input circuit of claim 11, wherein the bias circuit derives the bias voltages according to operations of the first differential pair.

19. The differential input circuit of claim 18, wherein the bias circuit further comprises:

a dummy differential pair formed by first and second dummy bipolar transistors connected to a dummy current source, said first and second dummy bipolar transistors having base electrodes for receiving the voltages corresponding to the input voltages applied to the first and second input terminals, respectively; and a reference current source connected to the first and second dummy bipolar transistors, such that the bias voltages are obtained as differences of currents supplied from the reference current source and a sum of outputs of the first and second dummy bipolar transistors.

20. The differential input circuit of claim 18, wherein the bias circuit further comprises:

a monitoring bipolar transistor connected to a dummy current source, and having a base electrode connected to emitter electrodes of the first and second bipolar transistors in the first differential pair; and a reference current source connected to the monitoring bipolar transistor, such that the bias voltages are obtained as differences of currents supplied from the reference current source and collector currents of the monitoring bipolar transistor.

* * * * *